United States Patent
Legaspi, Jr. et al.

(10) Patent No.: US 6,867,480 B2
(45) Date of Patent: Mar. 15, 2005

(54) ELECTROMAGNETIC INTERFERENCE PACKAGE PROTECTION

(75) Inventors: Severino A. Legaspi, Jr., Santa Clara, CA (US); Manickam Thavarajah, San Jose, CA (US); Maurice O. Othieno, Union City, CA (US); Pradip D. Patel, Redwood City, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/458,130

(22) Filed: Jun. 10, 2003

(65) Prior Publication Data

US 2004/0251522 A1 Dec. 16, 2004

(51) Int. Cl.$^7$ .............................................. H01L 23/552
(52) U.S. Cl. ...................... 257/659; 257/422; 257/660; 257/678; 257/787; 438/106; 438/112; 438/124; 438/126; 438/127; 438/795
(58) Field of Search .................................. 257/422, 659, 257/660, 678–733, 787–795; 438/106, 112, 124, 126, 127, 795

(56) References Cited

U.S. PATENT DOCUMENTS 5,066,692 A * 11/1991 Isawa et al. ................ 523/458
5,166,772 A * 11/1992 Soldner et al. ............. 257/659
5,355,016 A * 10/1994 Swirbel et al. ............. 257/659
5,371,404 A * 12/1994 Juskey et al. ............... 257/659
5,406,117 A * 4/1995 Dlugokecki et al. ........ 257/659
5,650,659 A * 7/1997 Mostafazadeh et al. ..... 257/660
6,365,960 B1 * 4/2002 Pollock et al. .............. 257/659
6,479,886 B1 * 11/2002 Pollock et al. .............. 257/659
6,740,959 B2 * 5/2004 Alcoe et al. ................ 257/659

* cited by examiner

Primary Examiner—David Nelms
Assistant Examiner—Andy Huynh
(74) Attorney, Agent, or Firm—Luedeka, Neely & Graham, P.C.

(57) ABSTRACT

A method of shielding an integrated circuit from electromagnetic interference. The integrated circuit is at least partially encapsulated within an electromagnetic interference resistant molding compound, and then the integrated circuit is completely encapsulated within a second molding compound. In this manner, the electromagnetic interference resistant molding compound protects the integrated circuit from electromagnetic interference, while the second molding compound can be selected for properties traditionally desired in a molding compound, such as thermal, electrical insulating, and structural properties. Thus, the integrated circuit according to the present invention can be placed closer to structures, such as power supplies, which produce electromagnetic interference, without experiencing an unacceptable degradation of performance due to the electromagnetic interference caused by the structures.

20 Claims, 1 Drawing Sheet

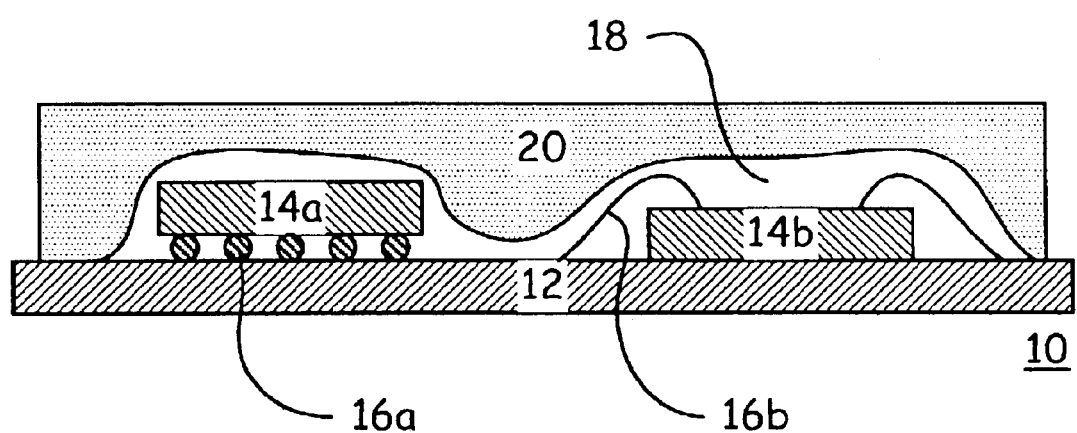

ELECTROMAGNETIC INTERFERENCE PACKAGE PROTECTION

FIELD

This invention relates to the field of integrated circuit fabrication. More particularly, this invention relates to packaging for integrated circuits, which packaging protects the integrated circuit from electromagnetic interference.

BACKGROUND

Electromagnetic radiation can be produced in a variety of ways. For example, the windings of a transformer, such as is commonly found within a power supply, can set up an electrical field which produces electromagnetic radiation. Other devices, such as relays and other components can also produce electromagnetic radiation. Such sources of electromagnetic radiation are not uncommon within electrical systems.

Unfortunately, many devices, such as semiconductor devices, that may also be present within a given electrical system, tend to be highly susceptible to electromagnetic radiation. In such a case, the condition is generally called electromagnetic interference. The effects of electromagnetic interference must be carefully considered during the design and implementation of a given electrical system. If elements of the electrical system that are sensitive to electromagnetic interference are placed too close to a source of electromagnetic radiation, then they may not function properly. This can reduce the overall reliability of the electrical system, or cause it to not function at all.

Thus, electromagnetic interference susceptible parts are preferably located at some distance from the sources of electromagnetic radiation. Sometimes this is not a difficult design constraint within the, electrical system. However, at other times this design constraint provides a multitude of problems with component placement. At the very least it may require a given electrical system to be larger than is otherwise necessary, just so as to put the electromagnetic radiation susceptible parts at a sufficient distance away from the electromagnetic radiation producing sources.

What is needed, therefore, is a system by which an electromagnetic interference susceptible component, such as an integrated circuit, is shielded from electromagnetic interference.

SUMMARY

The above and other needs are met by a method of shielding an integrated circuit from electromagnetic interference. The integrated circuit is at least partially encapsulated within an electromagnetic interference resistant molding compound, and then the integrated circuit is completely encapsulated within a second molding compound, which is different from the electromagnetic interference resistant molding compound.

In this manner, the electromagnetic interference resistant molding compound protects the integrated circuit from electromagnetic interference, while the second molding compound can be selected for properties traditionally desired in a molding compound, such as thermal, electrical insulating, and structural properties. Thus, the packaged integrated circuit according to the present invention can be placed closer to structures, such as power supplies, which produce electromagnetic interference, without experiencing an unacceptable degradation of performance due to the electromagnetic interference caused by the structures.

In various preferred embodiments, the electromagnetic interference resistant molding compound comprises an epoxy impregnated with an electromagnetic shielding material. Preferably, the integrated circuit is completely encapsulated with the electromagnetic interference resistant molding compound. The integrated circuit is preferably electrically connected to a substrate with electrical connections between the integrated circuit and the substrate, and the electromagnetic interference resistant molding compound at least partially encapsulates the electrical connections. Alternately, the electromagnetic interference resistant molding compound completely encapsulates the electrical connections. Most preferably, the second molding compound completely encapsulates the electromagnetic interference resistant molding compound. In one embodiment the integrated circuit is one or more of at least one of a wire bonded integrated circuit and at least one of a ball bonded integrated circuit. A packaged integrated circuit formed according to the method is also anticipated.

According to another aspect of the invention there is described a method of shielding an integrated circuit from electromagnetic interference. The integrated circuit is electrically connected to a substrate with electrical connections between the integrated circuit and the substrate. Both the integrated circuit and the electrical connections are at least partially encapsulated within an electromagnetic interference resistant molding compound. Both the integrated circuit and the electrical connections are completely encapsulated within a second molding compound.

In various preferred embodiments, the electromagnetic interference resistant molding compound comprises an epoxy impregnated with an electromagnetic shielding material. Preferably the integrated circuit is completely encapsulated with the electromagnetic interference resistant molding compound. Also, the electrical connections are preferably completely encapsulated with the electromagnetic interference resistant molding compound. The second molding compound preferably completely encapsulates the electromagnetic interference resistant molding compound. In one embodiment the integrated circuit is a wire bonded integrated circuit and the electrical connections are wires. In an alternate embodiment the integrated circuit is a ball bonded integrated circuit and the electrical connections are bumps.

According to yet another aspect of the invention there is described a packaged integrated circuit, including an integrated circuit. An electromagnetic interference resistant molding compound at least partially encapsulates the integrated circuit, and a second molding compound completely encapsulates the integrated circuit.

In various preferred embodiments the integrated circuit is completely encapsulated with the electromagnetic interference resistant molding compound. Preferably, the packaged integrated circuit also includes a substrate and electrical connections electrically connecting the integrated circuit to the substrate. In this embodiment, the electromagnetic interference resistant molding compound preferably also at least partially encapsulates the electrical connections. Most preferably, the second molding compound completely encapsulates the electromagnetic interference resistant molding compound.

BRIEF DESCRIPTION OF THE DRAWINGS

Further advantages of the invention are apparent by reference to the detailed description when considered in conjunction with the FIGURE, which is not to scale so as to more clearly show the details, and which is a cross sectional depiction of a packaged integrated circuit according to the present invention.

DETAILED DESCRIPTION

With reference now to the FIGURE, there is presented a cross sectional depiction of a packaged integrated circuit 10 according to the present invention. The packaged integrated circuit 10 preferably includes a substrate 12, upon which at least one integrated circuit 14 is mounted and electrically connected. As depicted, integrated circuit 14a is a ball bond integrated circuit, and integrated circuit 14b is a wire bond integrated circuit. It is appreciated that the packaged integrated circuit 10 may include only a single integrated circuit 14 of either type, or multiple integrated circuits 14 of either type, or a mixture of one or more integrated circuits 14 of both types.

The integrated circuits 14 are preferably electrically connected to the substrate 12 by electrical connections 16, which in the case of the ball bond integrated circuit 14a are bumps 16a, and in the case of the wire bond integrated circuit 14b are wires 16b. It is most preferred that the fabrication of the packaged integrated circuit 10 proceeds to this point in exactly the same manner as is done with prior art packaged integrated circuits.

At this point in the fabrication of the packaged integrated circuit 10, it is preferred to encapsulate at least a portion of the integrated circuit or circuits 14 with an electromagnetic interference resistant molding compound 18. Most preferably, the electromagnetic interference resistant molding compound 18 is an epoxy impregnated with an electromagnetic shielding material. The electromagnetic interference resistant molding compound 18 preferably encapsulates at least a portion of the electrical connections 16.

It is appreciated that in the embodiments where more than one integrated circuit 14 is present, and more than one set of electrical connections 16 are present, that only some of the integrated circuits 14 and only some of the electrical connections 16 may be at least partially encapsulated with the electromagnetic interference resistant molding compound 18. However, in the most preferred embodiment, all of the integrated circuits 14 present and all of the electrical connections 16 present are entirely encapsulated with the electromagnetic interference resistant molding compound 18 in the packaged integrated circuit 10, as depicted in the FIGURE.

Preferably, the amount of the electromagnetic interference resistant molding compound 18 used in the packaged integrated circuit 10 is just enough so as to provide the desired degree of electromagnetic interference shielding to the integrated circuit 14. The electromagnetic interference resistant molding compound 18 preferably flows around the integrated circuit 14 and the electrical connections 16, and thus provides electromagnetic interference shielding in a manner that a package insert or cap could not.

The electromagnetic interference resistant molding compound 18 is preferably selected primarily for its ability to provide electromagnetic interference shielding. However, the electromagnetic interference resistant molding compound 18 is also preferably electrically non conductive, so that it does not short the integrated circuits 14 or the electrical connections 16, but instead can be in intimate contact with both the integrated circuits 14 and the electrical connections 16. However, other properties, such as heat conductance and structural support, are not as important in the electromagnetic interference resistant molding compound 18, because these properties are preferably provided by a second molding compound, as described below.

The electromagnetic interference resistant molding compound 18 is preferably over-coated with a second molding compound 20, which preferably completely encapsulates the integrated circuits 14. The second molding compound 20 preferably completely encapsulates the electrical connections 16. The second molding compound 20 preferably completely encapsulates the electromagnetic interference resistant molding compound 18. These preferred conditions are depicted in the FIGURE. As used herein, the phrase "completely encapsulates" in regard to a molding compound 18 or 20 refers to completely encapsulating an integrated circuit 14 against a substrate 12, as depicted in the figure, in those cases in which a substrate 12 is present.

The second molding compound 20 is preferably a standard molding compound as is typically used in prior art packaged integrated circuits. Thus, it is selected for properties other than any shielding which it may provide to an integrated circuit 14 from electromagnetic interference, and indeed, standard prior art molding compounds provide essentially no shielding from electromagnetic interference.

Thus, the present invention provides the benefit of electronic protection by shielding the integrated circuit 14 from electromagnetic interference with the electromagnetic interference resistant molding compound 18, and physical protection to the integrated circuit 14 with the second molding compound 20.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of shielding an integrated circuit from electromagnetic interference, the method comprising the steps of:
   at least partially encapsulating the integrated circuit within an electromagnetic interference resistant molding compounding, and
   completely encapsulating the integrated circuit within a second molding compound,
   where the electromagnetic interference resistant molding compound is disposed between the integrated circuit and the second molding compound.

2. The method of claim 1, wherein the electromagnetic interference resistant molding compound comprises an epoxy impregnated with an electromagnetic shielding material.

3. The method of claim 1, wherein the integrated circuit is completely encapsulated with the electromagnetic interference resistant molding compound.

4. The method of claim 1, wherein the integrated circuit is electrically connected to a substrate with electrical connections between the integrated circuit and the substrate, and the electromagnetic interference resistant molding compound at least partially encapsulates the electrical connections.

5. The method of claim 1, wherein the integrated circuit is electrically connected to a substrate with electrical connections between the integrated circuit and the substrate, and the electromagnetic interference resistant molding compound completely encapsulates the electrical connections.

6. The method of claim 1, wherein the second molding compound completely encapsulates the electromagnetic interference resistant molding compound.

7. The method of claim 1, wherein the integrated circuit is a wire bond integrated circuit.

8. The method of claim 1, wherein the integrated circuit is a ball bond integrated circuit.

9. A packaged integrated circuit formed according to the method of claim 1.

10. A method of shielding an integrated circuit from electromagnetic interference, the method comprising the steps of:

electrically connecting the integrated circuit to a substrate with electrical connections between the integrated circuit and the substrate, at least partially encapsulating both the integrated circuit and the electrical connections within an electromagnetic interference resistant molding compound, and completely encapsulating the integrated circuit and the electrical connections within a second molding compound, where the electromagnetic interference resistant molding compound is disposed between the integrated circuit and the second molding, compound.

11. The method of claim 10, wherein the electromagnetic interference resistant molding compound comprises an epoxy impregnated with an electromagnetic shielding material.

12. The method of claim 10, wherein the integrated circuit is completely encapsulated with the electromagnetic interference resistant molding compound.

13. The method of claim 10, wherein the electrical connections are completely encapsulated with the electromagnetic interference resistant molding compound.

14. The method of claim 10, wherein the second molding compound completely encapsulates the electromagnetic interference resistant molding compound.

15. The method of claim 10, wherein the integrated circuit is a wire bond integrated circuit and the electrical connections are wires.

16. The method of claim 10, wherein the integrated circuit is a ball bond integrated circuit and the electrical connections are bumps.

17. A packaged integrated circuit, comprising:

an integrated circuit, an electromagnetic interference resistant molding compound at least partially encapsulating the integrated circuit, and a second molding compound completely encapsulating the integrated circuit where the electromagnetic interference resistant molding compound is disposed between the integrated circuit and the second molding compound.

18. The packaged integrated circuit of claim 17, wherein the integrated circuit is completely encapsulated with the electromagnetic interference resistant molding compound.

19. The packaged integrated circuit of claim 17, further comprising:

a substrate, and electrical, connections electrically connecting the integrated circuit to the substrate, where the electromagnetic interference resistant molding compound at least partially encapsulates the electrical connections.

20. The packaged integrated circuit of claim 17, wherein the second molding compound completely encapsulates the electromagnetic interference resistant molding compound.

* * * * *